(12) United States Patent
Park et al.

(10) Patent No.: US 11,490,503 B2
(45) Date of Patent: Nov. 1, 2022

(54) SUBSTRATE WITH ELECTRONIC COMPONENT EMBEDDED THEREIN

(71) Applicant: SAMSUNG ELECTRO-MECHANICS CO., LTD., Suwon-si (KR)

(72) Inventors: Chang Hwa Park, Suwon-si (KR); Chi Seong Kim, Suwon-si (KR); Eun Heay Lee, Suwon-si (KR); Yo Han Song, Suwon-si (KR); Gun Hwi Hyung, Suwon-si (KR); Jae Heun Lee, Suwon-si (KR); Deok Man Kang, Suwon-si (KR); Jin Oh Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 8 days.

(21) Appl. No.: 17/204,058

(22) Filed: Mar. 17, 2021

(65) Prior Publication Data
US 2022/0022310 A1    Jan. 20, 2022

(30) Foreign Application Priority Data

Jul. 17, 2020  (KR) .......................... 10-2020-0088970

(51) Int. Cl.
| | |
|---|---|
| *H05K 3/22* | (2006.01) |
| *H05K 1/02* | (2006.01) |
| *H05K 1/18* | (2006.01) |
| *H05K 3/00* | (2006.01) |
| *H05K 3/30* | (2006.01) |

(52) U.S. Cl.
CPC .......... *H05K 1/0206* (2013.01); *H05K 1/186* (2013.01); *H05K 3/007* (2013.01); *H05K 3/0097* (2013.01); *H05K 3/22* (2013.01); *H05K 3/305* (2013.01)

(58) Field of Classification Search
CPC .............................. H05K 1/0206; H05K 3/22
USPC ........................................................ 361/705
See application file for complete search history.

(56) References Cited

U.S. PATENT DOCUMENTS

| | | | | |
|---|---|---|---|---|
| 2008/0007927 A1* | 1/2008 | Ito | ........................... | H01L 24/82 361/764 |
| 2011/0317382 A1* | 12/2011 | Cho | ..................... | H05K 1/0353 523/400 |
| 2012/0024583 A1* | 2/2012 | Lee | ........................ | H05K 1/186 29/852 |
| 2014/0144676 A1* | 5/2014 | Chung | ................... | H05K 1/186 174/251 |
| 2015/0055309 A1* | 2/2015 | Bae | ........................ | H01L 23/481 438/126 |

(Continued)

FOREIGN PATENT DOCUMENTS

| | | |
|---|---|---|
| JP | 2013-211480 A | 10/2013 |
| KR | 10-1497230 B1 | 2/2015 |

*Primary Examiner* — Sherman Ng
(74) *Attorney, Agent, or Firm* — Morgan, Lewis & Bockius LLP

(57) ABSTRACT

A substrate with an electronic component embedded therein includes: a core structure having a cavity; a metal layer disposed on a bottom surface of the cavity of the core structure; and an electronic component disposed on the metal layer in the cavity of the core structure. The substrate with the electronic component embedded therein has an excellent heat dissipation effect.

20 Claims, 12 Drawing Sheets

(56) References Cited

U.S. PATENT DOCUMENTS

2016/0120025 A1* 4/2016 Kim .................... H05K 1/0218
174/257

* cited by examiner

I-I'

II-II'

SUBSTRATE WITH ELECTRONIC COMPONENT EMBEDDED THEREIN

CROSS-REFERENCE TO RELATED APPLICATION(S)

This application claims benefit of priority to Korean Patent Application No. 10-2020-0088970 filed on Jul. 17, 2020 in the Korean Intellectual Property Office, the disclosure of which is incorporated herein by reference in its entirety.

BACKGROUND

The present disclosure relates to a substrate with an electronic component embedded therein.

As electronic devices in the information technology (IT) field, including mobile phones, have become light and thin, in response to the technical demand therefor, a technology in which an electronic component such as an integrated circuit (IC) is inserted into the printed circuit board is required, and a technology in which an electronic component is embedded in the printed circuit board has been developed in recent years using various methods.

Meanwhile, as the performance of the electronic component increases and an amount of signal transmission between the components increases, heat generation in the electronic component increases. Accordingly, many studies and developments have been conducted on the heat dissipation design of a printed circuit board in which such electronic components are embedded.

SUMMARY

An aspect of the present disclosure is to provide a substrate with an electronic component embedded therein having an excellent heat dissipation effect.

Another aspect of the present disclosure is to provide a substrate with an electronic component embedded therein having excellent wiring design efficiency.

According to one of the various solutions proposed through the present disclosure, a first metal layer is disposed on a bottom surface of a cavity in which an electronic component is disposed, and a second metal layer is disposed on a side surface of the electronic component, to diversify a heat dissipation path while simultaneously increasing a heat dissipation area.

According to an aspect of the present disclosure, a substrate with an electronic component embedded therein may include: a core structure including a first insulating body, a plurality of first wiring layers respectively disposed on or in the first insulating body, and one or more first via layers disposed in the first insulating body, the core structure having a cavity penetrating through at least a portion of the first insulating body; a first metal layer disposed on a bottom surface of the cavity; an electronic component disposed on the first metal layer in the cavity; and a second metal layer disposed on a side surface of the electronic component.

According to another of the various solutions proposed through the present disclosure, a metal layer is disposed on a bottom surface of a cavity in which an electronic component is disposed, a pattern hole is formed in the metal layer, to use a portion of barrier metal for forming the cavity as a heat dissipation via, while the remainder thereof is used as a signal path.

According to an aspect of the present disclosure, a substrate with an electronic component embedded therein may include: a core structure including an insulating body, a plurality of wiring layers respectively disposed on or in the insulating body, and one or more via layers disposed in the insulating body, the core structure having a cavity penetrating through at least a portion of the insulating body; a metal layer disposed on a bottom surface, and having a pattern hole; and an electronic component disposed on the metal layer in the cavity.

According to an aspect of the present disclosure, a substrate may include: a core structure having a cavity and including an insulating body, one or more first wiring layers disposed on or in the insulating body, and one or more via layers disposed in the insulating body and connected to the one or more first wiring layers; a first metal layer disposed on or in the insulating layer; an electronic component disposed on the first metal layer in the cavity; and a second metal layer extending from the first metal layer to be in contact with a side surface of the electronic component.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
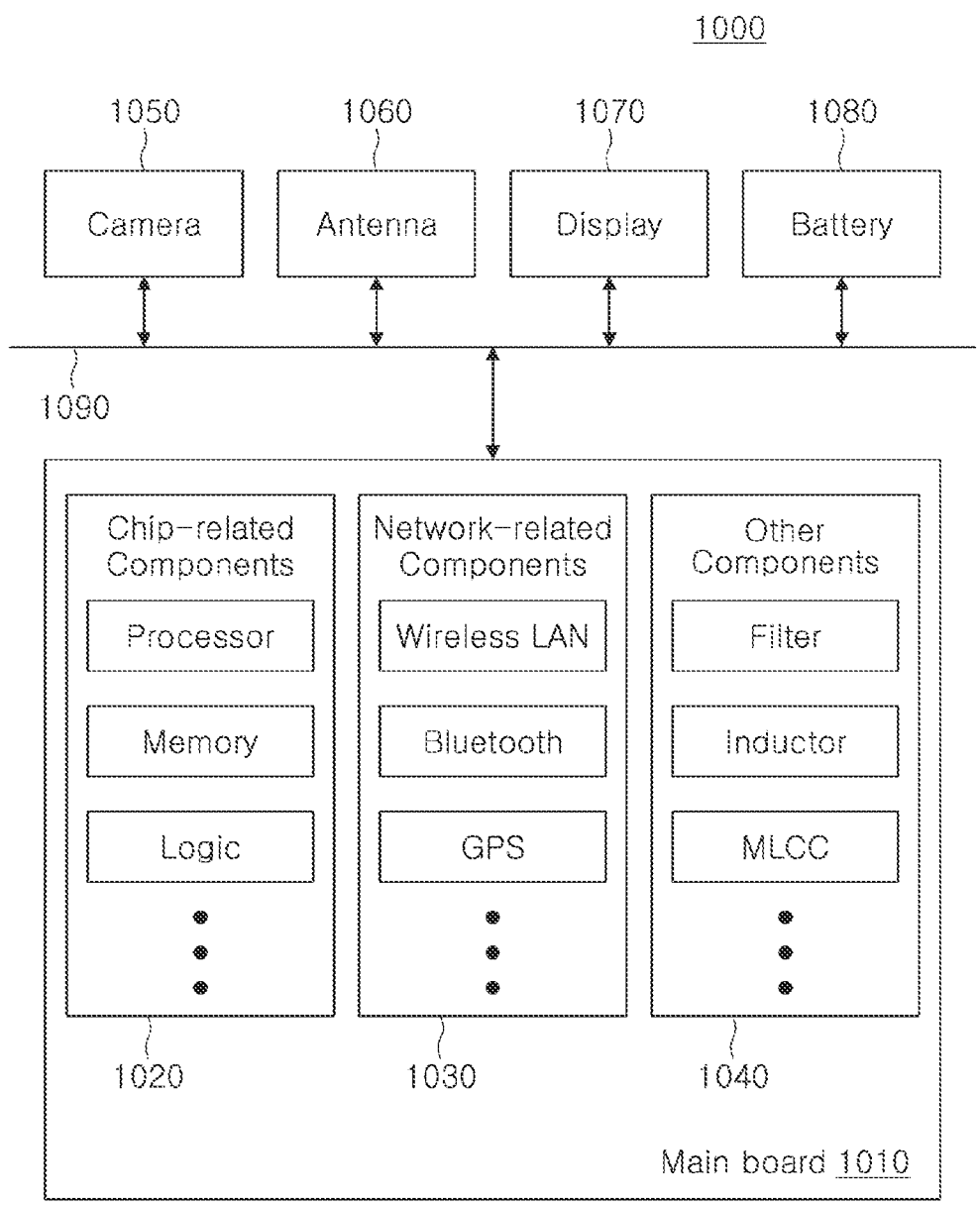
FIG. 1 is a block diagram illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
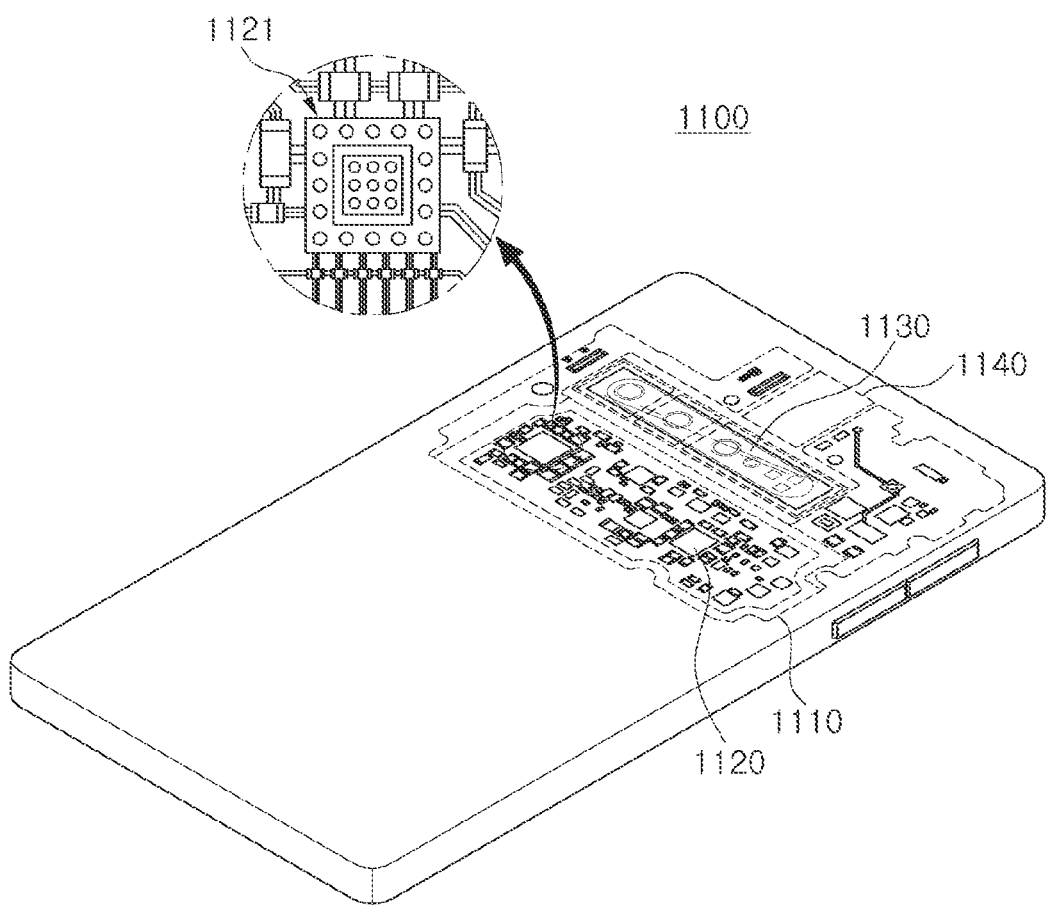
FIG. 2 is a perspective diagram illustrating an example of an electronic device.

FIG. 2 is a perspective diagram illustrating an example of an electronic device.

Referring to FIG. 2, a semiconductor package may be used for various purposes in the various electronic devices 1000 as described above. For example, a motherboard 1110 may be accommodated in a body of a smartphone 1100, and various electronic components 1120 may be physically or electrically connected to the motherboard 1110. In addition, other components that may or may not be physically or electrically connected to the motherboard 1110, such as a camera module 1130, may be accommodated in the body. Some of the electronic components 1120 may be the chip related components, a semiconductor package 1121, for example, but are not limited thereto. The electronic device is not necessarily limited to the smartphone 1100, but may be other electronic devices as described above.

Figure 3:
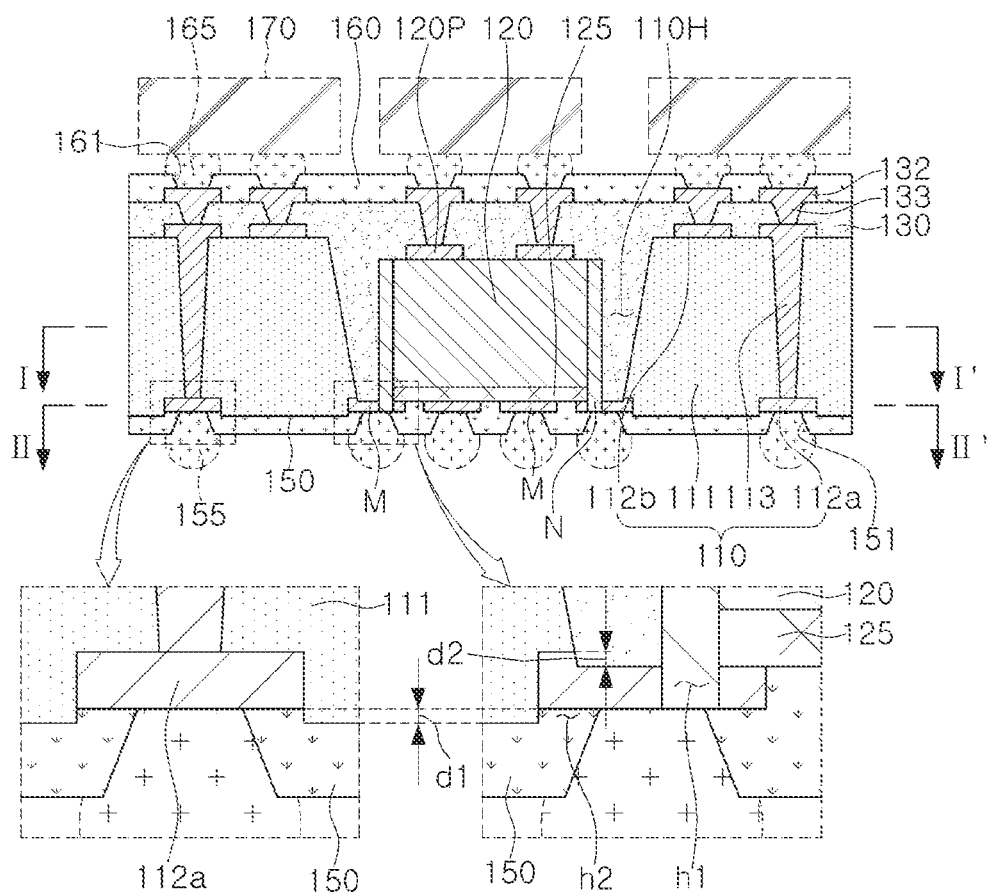
FIG. 3 is a cross-sectional diagram illustrating an example of a substrate with an electronic component embedded therein.

FIG. 3 is a cross-sectional diagram illustrating a substrate with an electronic component embedded therein.

Figure 4:
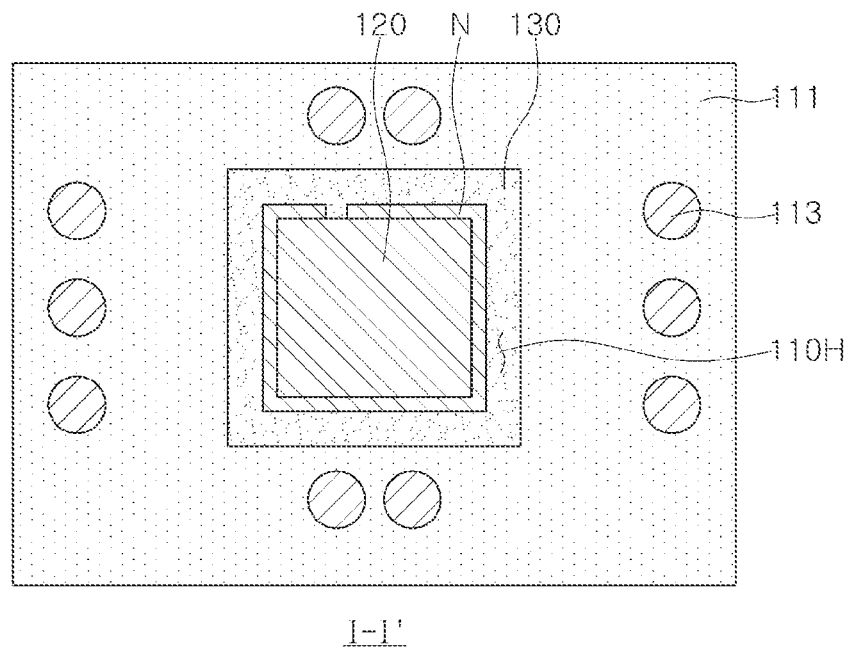
FIG. 4 is a schematic plan diagram illustrating the substrate with the electronic component embedded therein illustrated in FIG. 3 taken along line I-I'.

FIG. 4 is a cross-sectional plan diagram illustrating a substrate with an electronic component embedded therein illustrated in FIG. 3 taken along line I-I' in FIG. 3.

Figure 5:
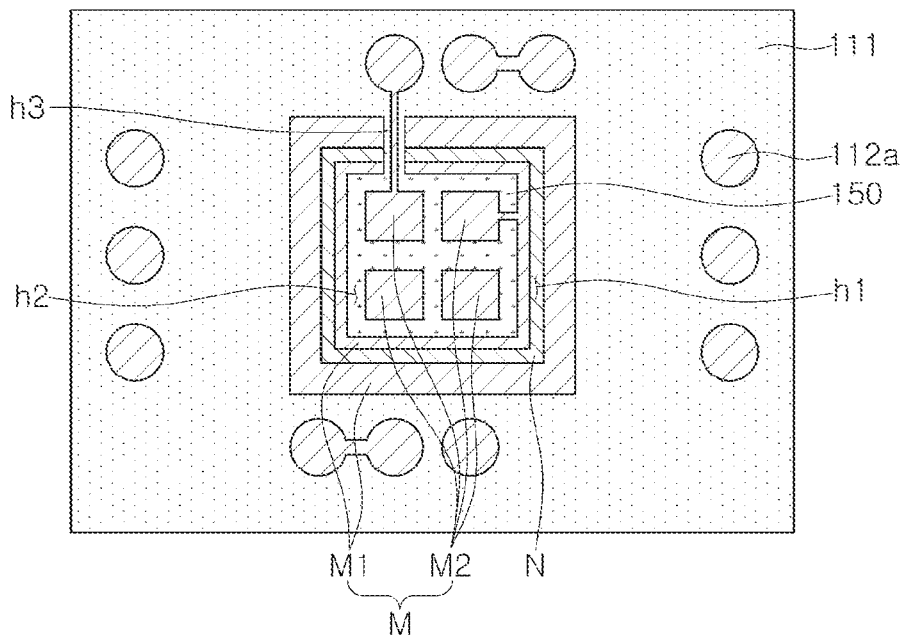
FIG. 5 is a schematic plan diagram illustrating the substrate with the electronic component embedded therein illustrated in FIG. 3 taken along line II-II'.

FIG. 5 is a cross-sectional plan diagram illustrating a substrate with an electronic component embedded therein illustrated in FIG. 3 taken along line II-II' in FIG. 3.

Referring to the diagrams, a substrate with an electronic component embedded therein 100A may include: a core structure 110 including a first insulating layer 111, a plurality of first wiring layers 112a and 112b, and one or more first via layers 113, the core structure 110 having a cavity 110H penetrating through the first insulating layer 111, a first metal layer M disposed on a bottom surface of the cavity 110H, an electronic component 120 disposed on the first metal layer M in the cavity 110H, and a second metal layer N disposed on a side surface of the electronic component 120.

As described above, in the electronic component embedded substrate 100A according to an example, the first metal layer M is disposed on the bottom surface of the cavity 110H in which the electronic component 120 is disposed, and the second metal layer M is disposed on the side of the electronic component 120. Accordingly, heat dissipation paths for dissipating heat generated from the electronic component 120 may be variously provided, and a heat dissipation area may be increased. Therefore, it can have an excellent heat dissipation effect.

Meanwhile, the second metal layer N may physically contact the side surface of the electronic component 120. In this case, heat generated from the electronic component 120 can be more effectively released. The second metal layer N may surround four side surfaces of the electronic component 120 on a plane. For example, the second metal layer N may continuously surround four side surfaces of the electronic component 120, but the present disclosure is not limited thereto, and there may be a partial discontinuous point h3 in a specific region.

Meanwhile, the second metal layer N may physically contact the first metal layer M. In this case, heat may be effectively transferred to the first metal layer M, and as a result, heat generated from the electronic component 120 may be effectively released. The first metal layer M may have a groove portion h1, and the second metal layer N may fill the groove portion h1. In this case, the groove portion h1 may be formed along four side surfaces of the electronic component 120 on a plane. For example, the groove portion h1 may be continuously formed along four side surfaces of the electronic component 120, but is not limited thereto, and there may be a partial discontinuous point h3 in a specific region.

In addition, in the substrate with an electronic component embedded therein 100A according to an example, the first metal layer M has a pattern hole h2. As a result, the first metal layer M may include a first metal pattern M1 having a groove portion h1 and a plurality of second metal patterns M2 surrounded by the first metal pattern M1 and spaced apart from each other. A portion of the plurality of second metal patterns M2 may be used as a direct heat dissipation path, and the remainder thereof may be used a signal path. Therefore, heat generated from a rear surface of the electronic component 120 may be effectively released externally through the first metal layer M by a shortest path, and at the same time, a portion of the first metal layer M may be used as a signal path, to improve the efficiency of wiring design. The pattern hole h2 may be one, or a plurality of pattern holes h2, distinguished from each other, and the number and shapes of the plurality of second metal patterns M2 may vary in various ways according to the formation of the pattern hole h2.

Meanwhile, at least a portion of the plurality of second metal patterns M2 may be electrically connected to at least one ground pattern among the plurality of first wiring layers 112a and 112b, and at least the remainder thereof may be electrically connected to at least one signal pattern among the plurality of first wiring layers 112a and 112b. The first metal pattern M1 may also be electrically connected to at least one ground pattern among the plurality of first wiring layers 112a and 112b, and thus, at least a portion of the plurality of second metal patterns M2 may be connected to the first metal pattern M1 and electrically connected to at least one ground pattern among the plurality of first wiring layers 112a and 112b thereby.

Alternatively, only the second metal layer N may be disposed without forming the pattern hole h2 in the first metal layer M, or conversely, only the pattern hole h2 may be formed in the first metal layer M without the disposition of the second metal layer N, but satisfying both cases may be more preferable for excellent heat dissipation effect and excellent wiring design.

Referring to the drawings, the substrate with an electronic component embedded therein 100A according to an example may further include an encapsulant 130 disposed on the core structure 110 to fill at least a portion of the cavity 110H and embed at least a portion of the electronic component 120, a second wiring layer 132 disposed on the encapsulant 130, a second via layer 133 penetrating through the encapsulant 130, a first passivation layer 150 disposed below the core structure 110, and/or a second passivation layer 160 disposed on the encapsulant 130. In this case, the first passivation layer 150 may have a plurality of first openings 151 respectively exposing at least a portion of a 1-1 wiring layer 112a disposed on the lowermost side and at least a portion of the first metal layer M. In this case, since the first metal layer M can be effectively used as a direct heat dissipation via, the heat dissipation effect may be enhanced by minimizing the heat dissipation path.

Referring to the drawings, the substrate with the electronic component embedded therein 100A according to an example may further include a plurality of first electrical connection metals 155 respectively disposed in a plurality of first openings 151 of the first passivation layer 150, a plurality of second electrical connection metals 165 respectively disposed in a plurality of second openings 152 of the second passivation layer 160, and a plurality of surface mounted components 170 that are surface-mounted on the second passivation layer 160 through the plurality of second electrical connection metals 165. As described above, the electronic component embedded substrate 100A according to an example may be used as a package substrate, and may have a package module form by providing the surface-mounted components 170.

Hereinafter, components of the substrate with the electronic component embedded therein 100A according to an example will be described in more detail with reference to the drawings.

The core structure 110 includes an insulating body including a first insulating layer 111, a plurality of first wiring layers 112a and 112b respectively disposed on or in the insulating body, and one or more first via layers 113 disposed in the insulating body. In addition, the core structure 110 may have a cavity 110H penetrating through the first insulating layer 111. For example, the core structure 110 may include a first insulating layer 111, a 1-1 wiring layer 112a embedded in a lower portion of the first insulating layer 111, a 1-2 wiring layer 112b disposed on an upper surface of the first insulating layer 111, and a first via layer 113 penetrating through the first insulating layer 111 and electrically connecting the 1-1 wiring layer 112a and the 1-2 wiring layer 112b, and may have a cavity 110H penetrating through the first insulating layer 111.

As a material of the first insulating layer 111, an insulating material may be used. As an insulating material, a thermosetting resin such as an epoxy resin, or a thermoplastic resin such as a polyimide resin may be used. In addition, an insulating material in which an inorganic filler such as silica and a reinforcing material such as glass fiber are contained in these resins, may be used. For example, prepreg may be used as the material of the first insulating layer 111, but is not limited thereto.

The first wiring layers 112a and 112b may include a metal material. As the metal material, copper (Cu), aluminum (Al), silver (Ag), tin (Sn), gold (Au), nickel (Ni), lead (Pb), titanium (Ti), or alloys thereof may be used. The first wiring layers 112a and 112b may perform various functions according to the design of the corresponding layer. For example, the first wiring layers 112a and 112b may include a ground pattern, a power pattern, a signal pattern, or the like. Each of the patterns may have a line, a plane, and/or a pad shape. The first wiring layers 112a and 112b may be formed of an additive process (AP), a semi AP (SAP), a modified SAP (MSAP), tenting (TT), and the like, and as a result, may include a seed layer, an electroless plating layer, and an electrolytic plating layer formed based on the seed layer.

A lower surface of the 1-1 wiring layer 112a may have a first step d1 with a lower surface of the first insulating layer 111. For example, the 1-1 wiring layer 112a may be formed by an embedded trace substrate (ETS) method, and as described later, the metal foil serving as the seed layer may be removed to form the first step d1. The 1-1 wiring layer 112a may exist as a seed layer, a separate electroless plating layer, and may include only a single electrolytic plating layer.

On the other hand, the 1-2 wiring layer 112b may include a seed layer, an electroless plating layer, and an electroplating layer formed on the basis of the seed layer. When resin coated copper (RCC) is used as the first insulating layer 111, a metal foil such as copper foil may be further included on the lowermost side. If necessary, a primer resin formed on a surface of the copper foil may also be further included.

The first via layer 113 may include a metal material. As the metal material, copper (Cu), aluminum (Al), silver (Ag), tin (Sn), gold (Au), nickel (Ni), lead (Pb), titanium (Ti), or alloys thereof may be used. The first via layer 113 may include a connection via for signal connection, a connection via for ground connection, and a connection via for power connection, and the like according to designs. Each of the connection vias of the first via layer 113 may be a via in which a via hole is completely filled with a metal material, respectively, or in which the metal material may be formed along a wall surface of the via hole. Each of the wiring vias may have a tapered shape in which a width of the upper surface is greater than a width of the lower surface. The first via layer 113 may be formed by plating processes such as an AP, a SAP, a MASP, TT, and the like, and as a result, may include a seed layer, an electroless plating layer, and an electrolytic plating layer formed based on the seed layer, similar to the 1-2 wiring layer.

The first metal layer M may include a metal material. As the metal material, copper (Cu), aluminum (Al), silver (Ag), tin (Sn), gold (Au), nickel (Ni), lead (Pb), titanium (Ti), or alloys thereof may be used. A central region of the first metal layer M may be exposed by the cavity 110H, and an edge region thereof may be embedded in the first insulating layer 111. In this case, an upper surface of the first metal layer M in the central region and an upper surface of the first metal layer M in the edge region may have a second step d2. For example, in a process of forming the cavity 110H using a sandblast process, a portion of the central region of the first metal layer M serving as a stopper may be removed by an attack of fine particles to form a second step d2.

A lower surface of the first metal layer M may have a first step d1 with a lower surface of the first insulating layer 111. For example, when forming the 1-1 wiring layer 112a, the first metal layer M may also be formed by the ETS method, such that the metal foil serving as the seed layer may be removed to form a first step d1. The first metal layer M may exist a seed layer, a separate electroless plating layer, and may include only a single electrolytic plating layer.

The first metal layer M may have a groove portion h1, and the groove portion h1 may be filled with the second metal layer N. The groove portion h1 may be formed along four side surfaces of the electronic component 120 on a plane. For example, it may be continuously formed along four side surfaces of the electronic component 120, but is not limited thereto, and there may be a partial discontinuous point h3 in a specific region. In addition, the first metal layer M may have a pattern hole h2, and the first metal layer M may include a first metal pattern M1 disposed along an edge of the cavity 110H by the pattern hole h2 and having a groove portion h1, and a plurality of second metal patterns M2 surrounded by the first metal pattern M1 and spaced apart from each other. The shape of each of the plurality of second metal patterns M2 is not particularly limited, and may have a line, a plane, and/or a pad shape. The pattern hole h2 may be filled with the first passivation layer 150.

The second metal layer N may include a metal material, and as the metal material, copper (Cu), aluminum (Al), silver (Ag), tin (Sn), gold (Au), nickel (Ni), lead (Pb), titanium (Ti), or alloys thereof may be used. The second metal layer N may be in physical contact with a side surface of the electronic component 120. The second metal layer N may surround four side surfaces of the electronic component 120 on a plane.

For example, the second metal layer N may continuously surround four side surfaces of the electronic component 120, but the present disclosure is not limited thereto, and there may be a partial discontinuous point h3 in a specific region. The second metal layer N may physically contact the first metal layer M. For example, the second metal layer N may fill the groove portion h1 of the first metal layer M. The second metal layer N may be formed by a plating process, for example, a process such as AP, SAP, MSAP, or TT. Accordingly, the second metal layer N may include a seed layer, an electroless plating layer formed on a bottom surface and a wall surface of a deep via to be described later, and an electroplating layer formed to fill the deep via based on the seed layer.

The electronic component 120 may be an integrated circuit (IC) in which hundreds to millions of elements are integrated in a single chip. For example, the electronic component 120 may be a processor chip such as a central processor (e.g., CPU), a graphic processor (e.g., GPU), a field programmable gate array (FPGA), a digital signal processor, an encryption processor, a microprocessor, a microcontroller, or the like, specifically, an application processor (AP), but is not limited thereto, and may be a memory such as a volatile memory (e.g., DRAM), a non-volatile memory (e.g., ROM), a flash memory, or the like, an analog-digital converter, or a logic such as an application-specific IC (ASIC), or the like.

The electronic component 120 may be disposed in a face-up form, so that a surface on which a connection pad 120P is disposed faces an upper portion, and an opposite surface thereof is attached to the first metal layer M through an adhesive film 125 such as a die attach film (DAF), or the like. As the adhesive film 125, an adhesive having excellent heat dissipation characteristics, for example, a DAF having excellent heat dissipation characteristics, may be used. The electronic component 120 may be a chip-shaped passive component, for example, a chip-shaped inductor or a chip-shaped capacitor. The electronic component 120 may be a combination of an IC and a passive component in a form of a chip, and in this case, a plurality of cavities 110H may be formed.

The encapsulant 130 may be disposed on the core structure 110 and may fill at least a portion of the cavity 110H, and may embed at least a portion of the electronic component 120. As a material of the encapsulant 130, an insulating material may be used. As the insulating material, a thermosetting resin such as an epoxy resin, or a thermoplastic resin such as a polyimide resin may also be used. In addition, an insulating material in which an inorganic filler such as silica is contained in these resins may also be used. For example, as the material of the encapsulant 130, an Ajinomoto build-up film (ABF) may be used, but is not limited thereto, and a photoimageable encapsulant (PIE) may also be used. Alternatively, prepreg may also be used.

The second wiring layer 132 may be disposed on an upper surface of the encapsulant 130. The second wiring layer 132 may include a metal material such as copper (Cu), aluminum (Al), silver (Ag), tin (Sn), gold (Au), nickel (Ni), lead (Pb), titanium (Ti), or alloys thereof. The second wiring layer 132 may perform various functions according to design. For example, the second wiring layer 132 may include a ground (GND) pattern, a power (PWR) pattern, a signal (S) pattern, and the like. Each of the patterns may have a line shape, a plane shape, or a pad shape.

The second wiring layer 132 may be formed through a process such as an AP, a SAP, a MSAP, a TT, or the like, and accordingly, the second wiring layer 132 may include a seed layer, an electroless plating layer, and an electrolytic plating layer formed based on the seed layer. When RCC is used as the encapsulant 130, a metal foil such as copper foil may be further included on the lowermost side, and a primer resin formed on a surface of the copper foil may be further included.

The second via layer 133 may penetrate through the encapsulant 130, and may electrically connect the second wiring layer 132 to each of the 1-2 wiring layer 112b and the connection pad 120P. The second via layer 133 may include a metal material such as copper (Cu), aluminum (Al), silver (Ag), tin (Sn), gold (Au), nickel (Ni), lead (Pb), titanium (Ti), or alloys thereof. The second via layer 133 may include a connection via used for a signal, a connection via used for a ground, a connection via used for power, and the like, according to a design. A wiring via of the second via layer 133 may be a via in which a via hole is completely filled with a metal material, or a metal material may be formed along a wall surface of the via hole. Each of the wiring vias may have a tapered shape in which a width of the upper surface is larger than a width of the lower surface. The second via layer 133 may also be formed by a plating process such as an AP, a SAP, a MSAP, a TT, or the like, and accordingly, the second via layer 133 may include a seed layer, an electroless plating layer, and an electrolytic plating layer formed based on the seed layer, similar to the second wiring layer 132.

First and second passivation layers 150 and 160 may protect an internal configuration from external physical and chemical damage, or the like. The first and second passivation layers 150 and 160 may have a plurality of first and second openings 151 and 161, respectively. The plurality of first openings 151 may expose at least a portion of each of the 1-1 wiring layer 112a and the first metal layer M, respectively. The plurality of second openings 161 may expose at least a portion of the second wiring layer 132, respectively. A material of the first and second passivation layers 150 and 160 may include an insulating material. In this case, as the insulating material, a thermosetting resin such as an epoxy resin, a thermoplastic resin such as a polyimide resin, a material in which the thermosetting resin or the thermoplastic resin are mixed with an inorganic filler, for example, ABF may be used, but is not limited thereto.

First and second electrical connection metals 155 and 165 are disposed on a plurality of first and second openings 151 and 161 of the first and second passivation layers 150 and 160, respectively. The first electrical connection metal 155 is connected to an exposed 1-1 wiring layer 112a and a first metal layer M. The second electrical connection metal 165 is connected to an exposed second wiring layer 132. The first electrical connection metal 155 may physically and/or electrically connect a substrate having an electronic component embedded therein 100A to an external entity. For example, the substrate having an electronic component embedded therein 100A may be mounted on a mainboard of an electronic device, a ball grid array (BGA), or the like, through the electrical connector metal 160. The second electrical connection metal 165 may physically and/or electrically connect a substrate having an electronic component embedded therein 100A to a component 170 surface-mounted thereon. The first and second electrical connection metals 155 and 165 may be formed of tin (Sn), or an alloy containing tin (Sn), for example, a solder, but this is merely an example, and the material is not particularly limited thereto. The first and second electrical connection metals 155 and 165 may be configured as a land, a ball, a pin, or the like, respectively.

Each of the surface mounted components 170 may be an active component and/or a passive component. Examples of the active component may include the IC described above for the electronic component 120. Examples of passive components may include chip-type capacitors such as a multi-layer ceramic capacitor (MLCC), and a chip-type inductors such as a power inductor (PI). If necessary, a molding material covering the surface-mounted component 170 may be further disposed on the second passivation layer 160, and the molding material may be a known Epoxy Molding Compound (EMC), but is not limited thereto. When the surface mount component 170 is further disposed, the substrate with the electronic component embedded therein 100A may be used as a package module, for example, a System in Package (SiP).

FIGS. 6 to 17 are diagrams illustrating an example of a process for manufacturing a substrate having an electronic component embedded therein illustrated in FIG. 3.

Figure 6:
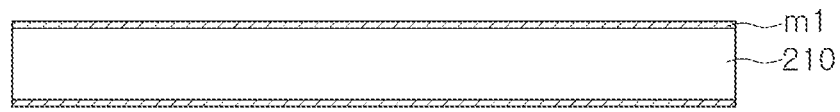
FIGS. 6 to 17 are cross-sectional diagrams schematically illustrating an example of manufacturing the substrate with the electronic component embedded therein of FIG. 3.

Referring to FIG. 6, a carrier 210 is prepared. A metal foil m1 such as a copper foil may be disposed on both side surfaces of the carrier 210.

Figure 7:
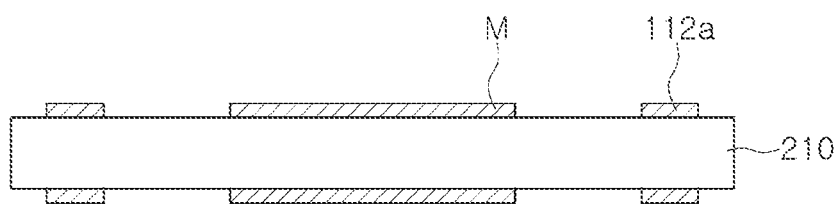

Referring to FIG. 7, a 1-1 wiring layer 112a and the first metal layer M are formed on the carrier 210 by an ETS plating process using a metal foil m1 as a basic seed layer.

Figure 8:
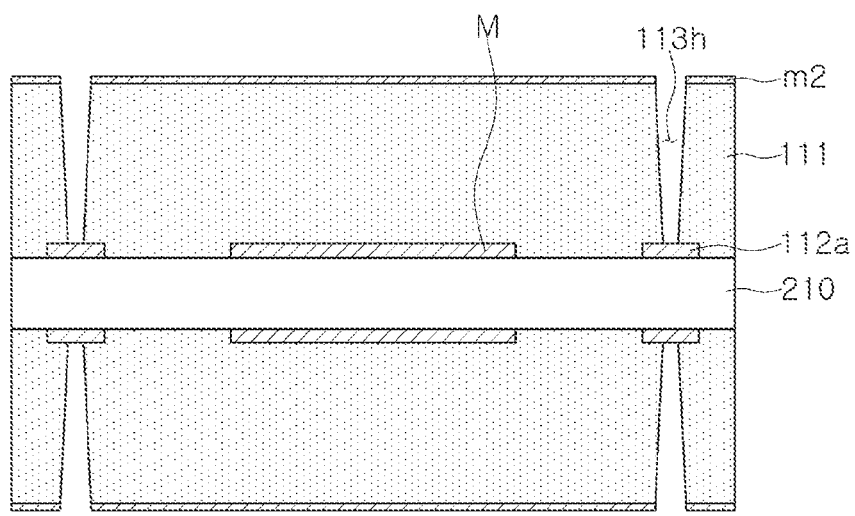

Referring to FIG. 8, a first insulating layer 111 is formed using an RCC material in which a metal foil m2 such as a copper foil is disposed on an upper surface of the prepreg. Thereafter, a via hole 113h is formed in the first insulating layer 111 by laser processing, or the like.

Figure 9:
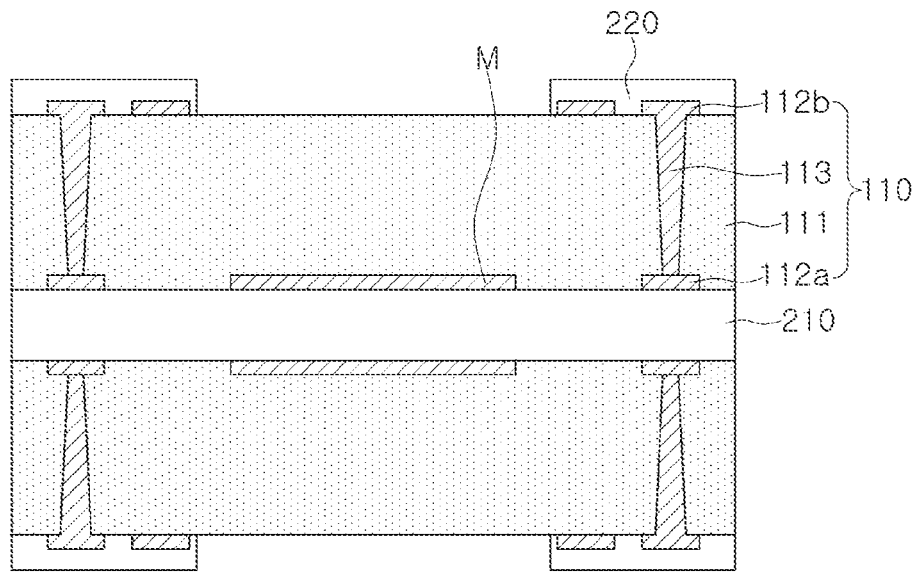

Referring to FIG. 9, a 1-2 wiring layer 112b and the first via layer 113 are formed by a plating process. Thereby, a core structure 110 is formed. Thereafter, a patterned dry film 220 is stacked on the core structure 110 to form the cavity 110H.

Figure 10:
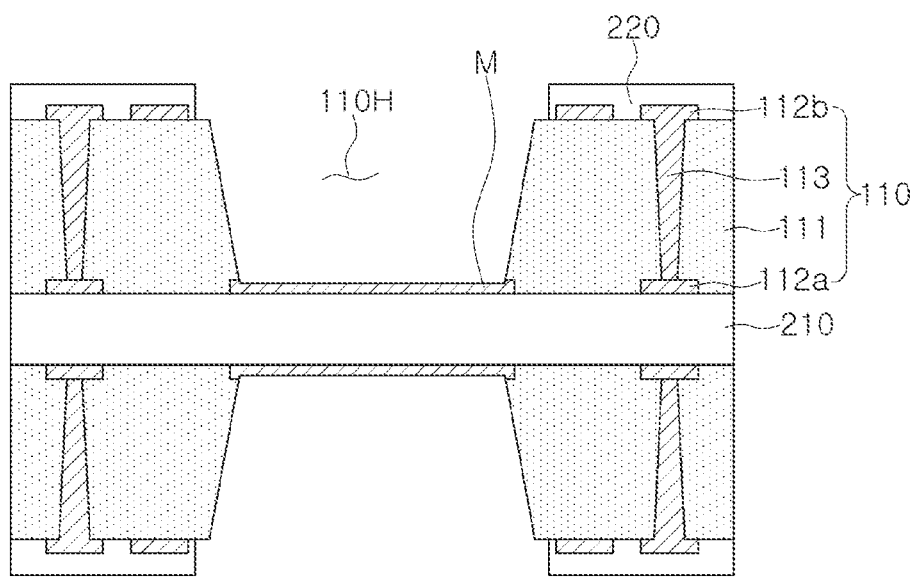

Referring to FIG. 10, a cavity 110H is formed by sand blasting, or the like. In this process, the first metal layer M may serve as a stopper, and a portion of the first metal layer M may be removed from a region exposed by the cavity 110H.

Figure 11:
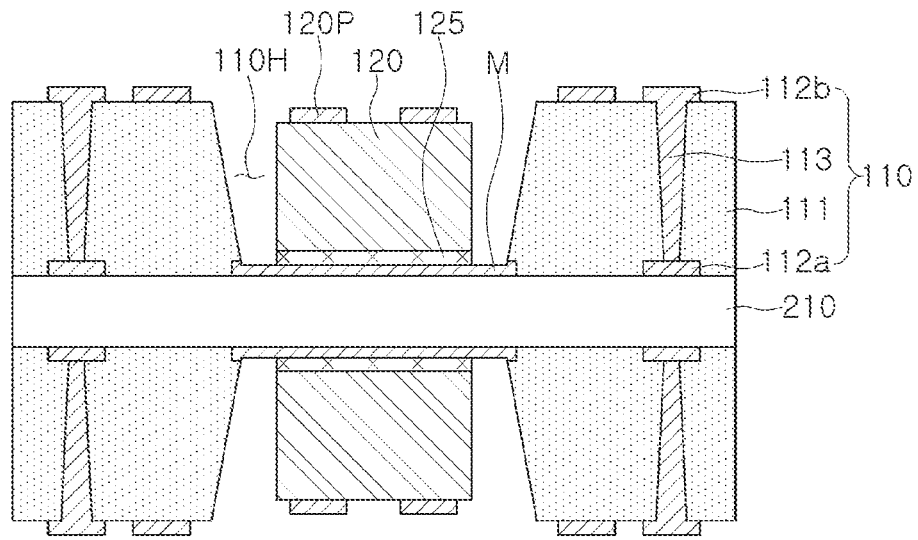

Referring to FIG. 11, a dry film 220 is removed, and the electronic component 120 is attached to the first metal layer M in the cavity 110H in a face-up form using an adhesive film 125.

Figure 12:
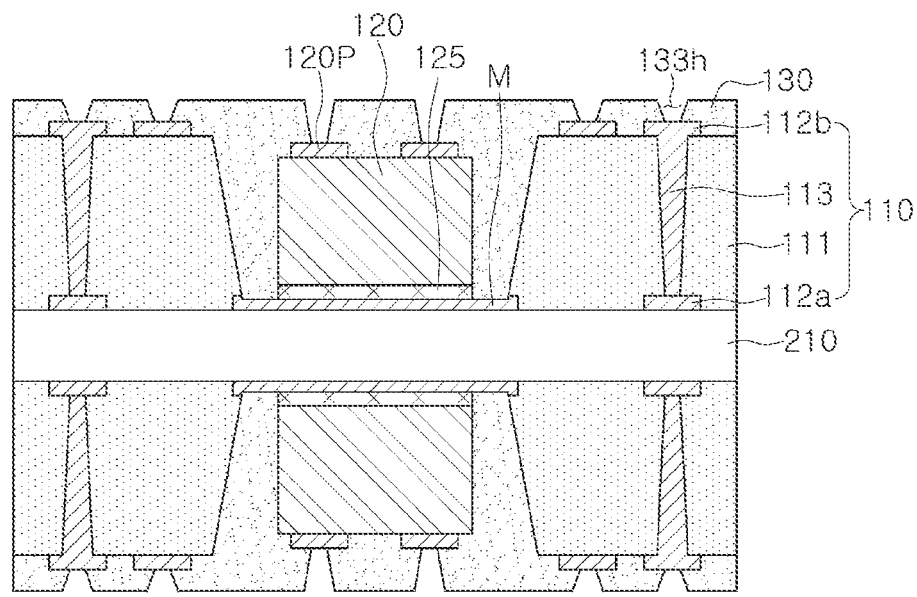

Referring to FIG. 12, an encapsulant 130 is formed on the core structure 110 by ABF lamination, and the via hole 133h is formed by laser processing, or the like.

Figure 13:
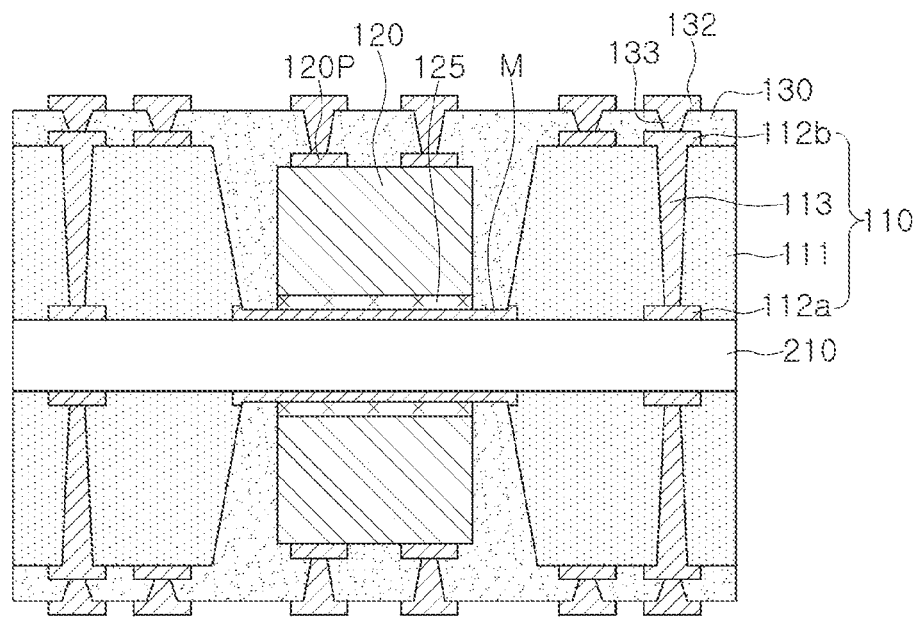

Referring to FIG. 13, a second wiring layer 132 and a second via layer 133 are formed by a plating process. A laminate is manufactured on both sides of the carrier through a series of processes.

Figure 14:
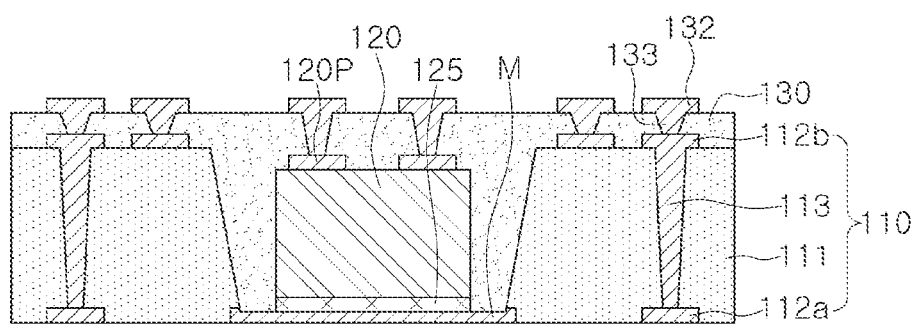

Referring to FIG. 14, the laminate is separated from the carrier 210.

Figure 15:
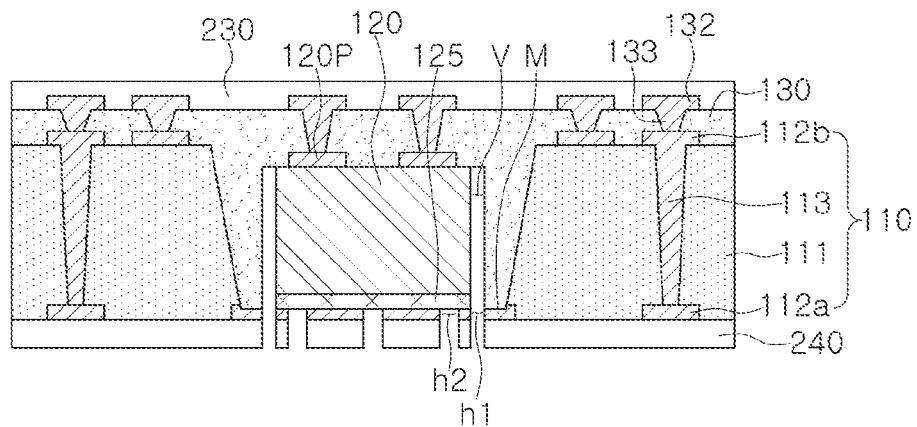

Referring to FIG. 15, dry films 230 and 240 are attached to both sides of the separated laminate, and a deep via V penetrating through the first metal layer M and the encapsulant 130 by laser processing, or the like, and a pattern hole h2 penetrating through the first metal layer M is formed. A region penetrating through the first metal layer M of the deep via V becomes the above-described groove portion h1.

Figure 16:
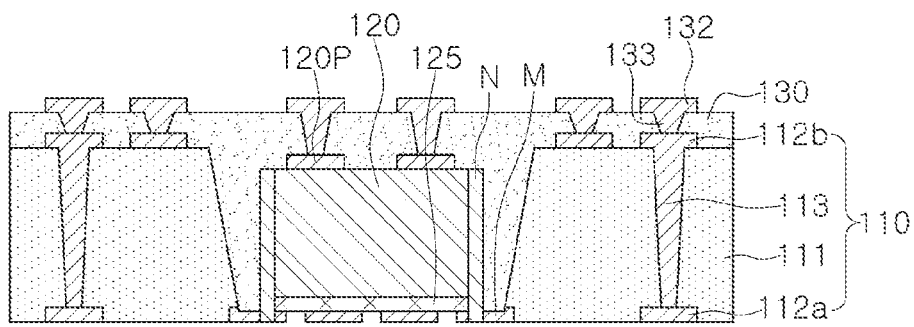

Referring to FIG. 16, a second metal layer N is formed by filling the deep via V by a plating process. In addition, the dry films 230 and 240 are removed.

Figure 17:
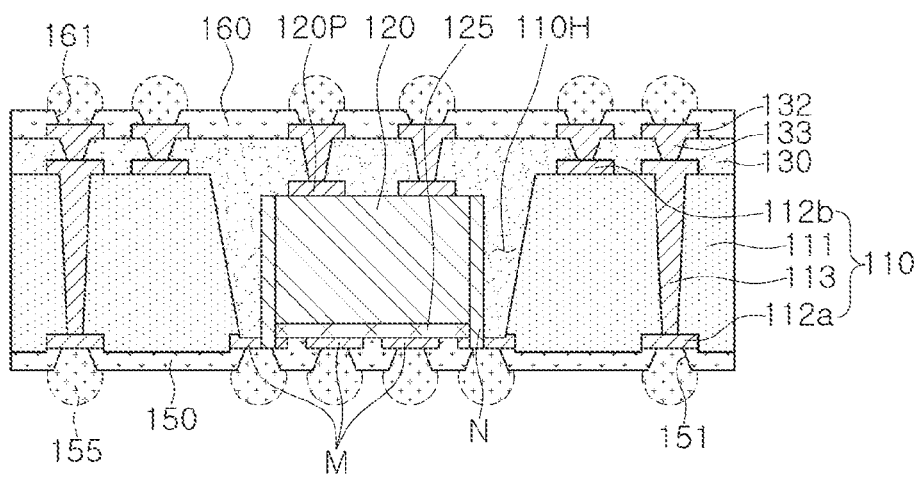

Referring to FIG. 17, first and second passivation layers 150 and 160 are formed by ABF lamination or the like, and a plurality of first and second openings 151 and 161 are formed by laser processing, or the like. Thereafter, as necessary, first and second electrical connection metals 155 and 165 are formed.

The electronic component embedded substrate 100A according to the above-described example may be manufactured through a series of processes, and other overlapping contents thereof are omitted.

Figure 18:
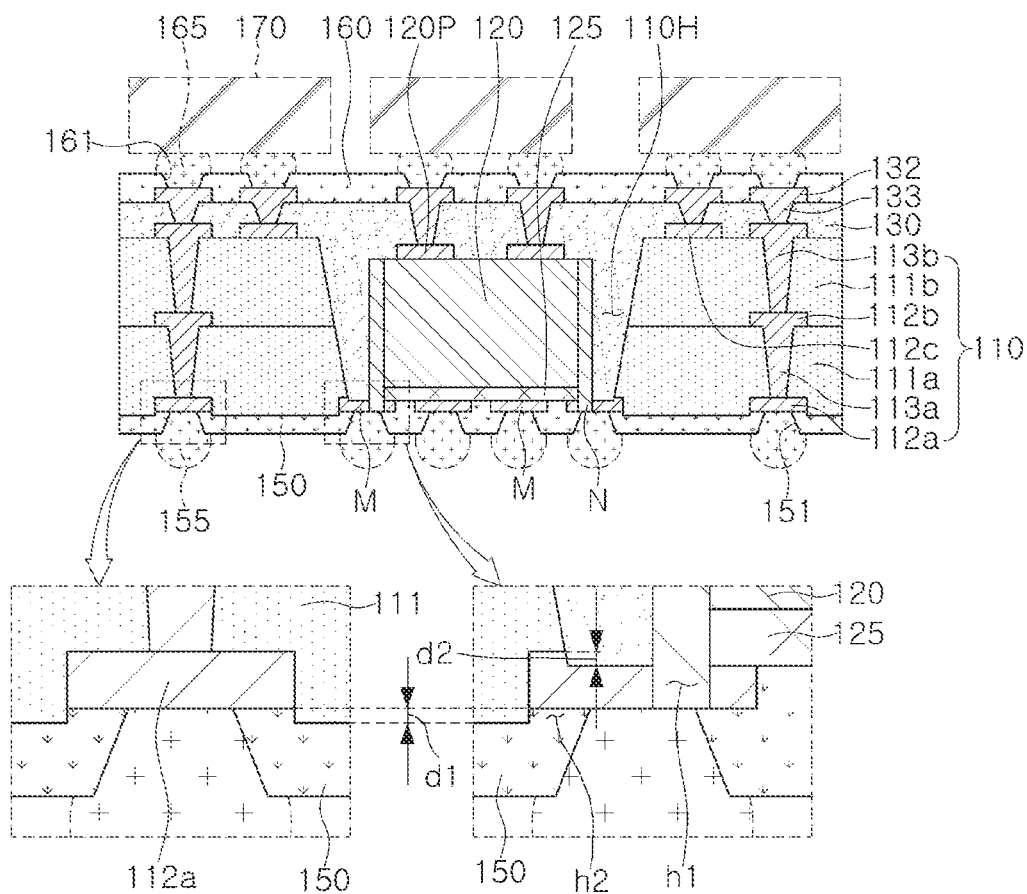
FIG. 18 is a cross-sectional diagram schematically illustrating another example of the substrate with the electronic component embedded therein.

FIG. 18 is a schematic cross-sectional view showing another example of a substrate having an electronic component embedded therein.

Referring to the drawings, in a substrate having an electronic component embedded therein 100B according to another example, a core structure 110 is formed in more multiple layers than in the substrate with the electronic component embedded therein 100A according to the above-described example. For example, the core structure 110 may include a 1-1 insulating layer 111a, a 1-1 wiring layer 112a embedded in a lower portion of the 1-1 insulating layer 111a, a 1-2 wiring layer 112b disposed on an upper surface of 1-1 insulating layer 111a, a 1-1 via layer penetrating through the 1-1 insulating layer 111a and electrically connecting the 1-1 wiring layer 112a and the 1-2 wiring layer 112b, a 1-2 insulating layer 111b disposed on the upper surface of the 1-1 insulating layer 111a and covering the 1-2 wiring layer 112b, a 1-3 wiring layer 112c disposed on an upper surface of the 1-2 insulating layer 111b, and a 1-2 via layer 113b penetrating through the 1-2 insulating layer 111b and electrically connecting the 1-2 wiring layer 112b and the 1-3 wiring layer 112c, and the cavity 110H may penetrate through the 1-1 insulating layer 111a and the 1-2 insulating layer 111b.

As such, the number of layers of the core structure 110 is not particularly limited, and may be formed in multiple layers according to a design. If necessary, it can be formed in multiple layers, other than those shown in the drawings. Other overlapping content thereof is omitted.

Figure 19:
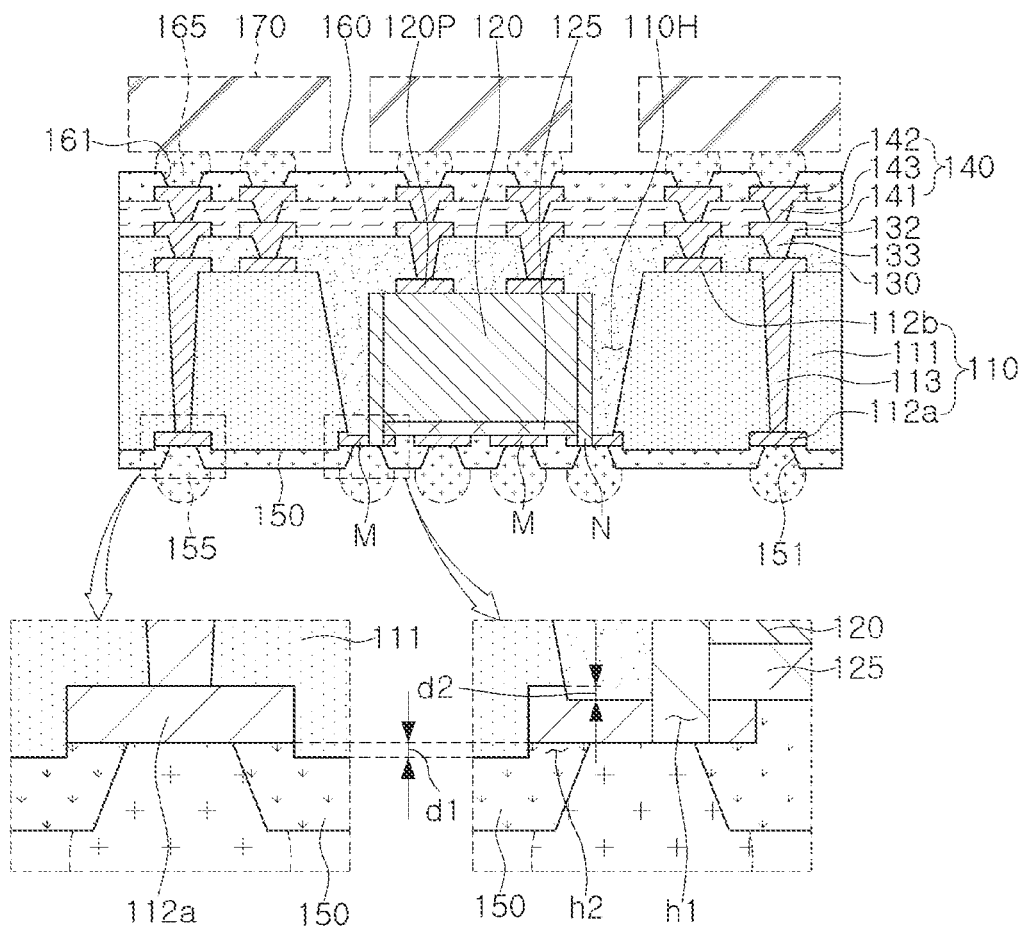
FIG. 19 is a cross-sectional diagram schematically illustrating another example of the substrate with the electronic component embedded therein.

FIG. 19 is a schematic cross-sectional view showing another example of a substrate having an electronic component embedded therein.

Referring to the drawings, in a substrate having an electronic component embedded therein 100C according to another example, a build-up structure 140 is further disposed on the encapsulant 130, than in the substrate with the electronic component embedded therein 100A according to the above-described example. The build-up structure 140 includes a second insulating body including a second insulating layer 141, one or more three wiring layers 142 disposed on or in the second insulating body, and one or more three via layers 143 disposed in the second insulating body. A second passivation layer 160 may be disposed on the build-up structure 140. The second passivation layer 160 may have a plurality of second openings 161 respectively exposing at least a portion of the third wiring layer 142.

As a material of the second insulating layer 141, an insulating material may be used. As an insulating material, a thermosetting resin such as an epoxy resin, or a thermoplastic resin such as a polyimide resin may be used. In addition, an insulating material in which an inorganic filler such as silica and a reinforcing material such as glass fiber are contained in these resins, may be used. For example, prepreg may be used as the material of the second insulating layer 141, but is not limited thereto, and a material that does not contain a reinforcing material such as glass fiber, for example, ABF or the like may be used. Alternatively, a photosensitive insulating material such as a photoimageable dielectric (PID) may be used.

The third wiring layer 142 may be disposed on an upper surface of the second insulating layer 141. The third wiring layer 142 may include a metal material such as copper (Cu), aluminum (Al), silver (Ag), tin (Sn), gold (Au), nickel (Ni), lead (Pb), titanium (Ti), or alloys thereof. The third wiring layer 142 may perform various functions in example embodiments. For example, the third wiring layer 142 may include a ground (GND) pattern, a power (PWR) pattern, a signal (S) pattern, and the like. Each pattern may have a line shape, a plane shape, or a pad shape. The third wiring layer 142 may be formed through a process such as an additive process (AP), a semi-AP (SAP) process, a modified SAP (MSAP) process, a tenting (TT) process, or the like, and accordingly, the third wiring layer 142 may include a seed layer, an electroless plating layer, and an electrolytic plating layer formed based on the seed layer. When an RCC is used as the second insulating layer 141, a metal foil such as copper foil may be further included at the lowermost side, and a primer resin formed on a surface of the copper foil may be further included.

The third via layer 143 may penetrate the second insulating layer 141, and may electrically connect the third wiring layer 142 to the second wiring layer 132. The third via layer 143 may include a metal material such as copper (Cu), aluminum (Al), silver (Ag), tin (Sn), gold (Au), nickel (Ni), lead (Pb), titanium (Ti), or alloys thereof. The third via layer 143 may include a connection via used for a signal, a connection via used for ground, a connection via used for power, and the like according to a design. Each wiring via of the second via layer 143 may be a via in which a via hole is completely filled with a metal material, or a metal material may be formed along a wall surface of the via hole. Each of the wiring vias may have a tapered shape in which a width of the upper surface is larger than a width of the lower surface. The third via layer 143 may also be formed by a plating process such as an AP, a SAP, a MSAP, a TT, or the like, and accordingly, the third via layer 143 may include a seed layer, an electroless plating layer, and an electrolytic plating layer formed based on the seed layer.

As such, a build-up structure 140 may be further disposed on the encapsulant 130, and the number of layers of the build-up structure 140 is not particularly limited, and may be formed in multiple layers according to designs. If necessary, it can be formed in multiple layers than those shown in the drawings. Other overlapping content thereof is omitted.

Figure 20:
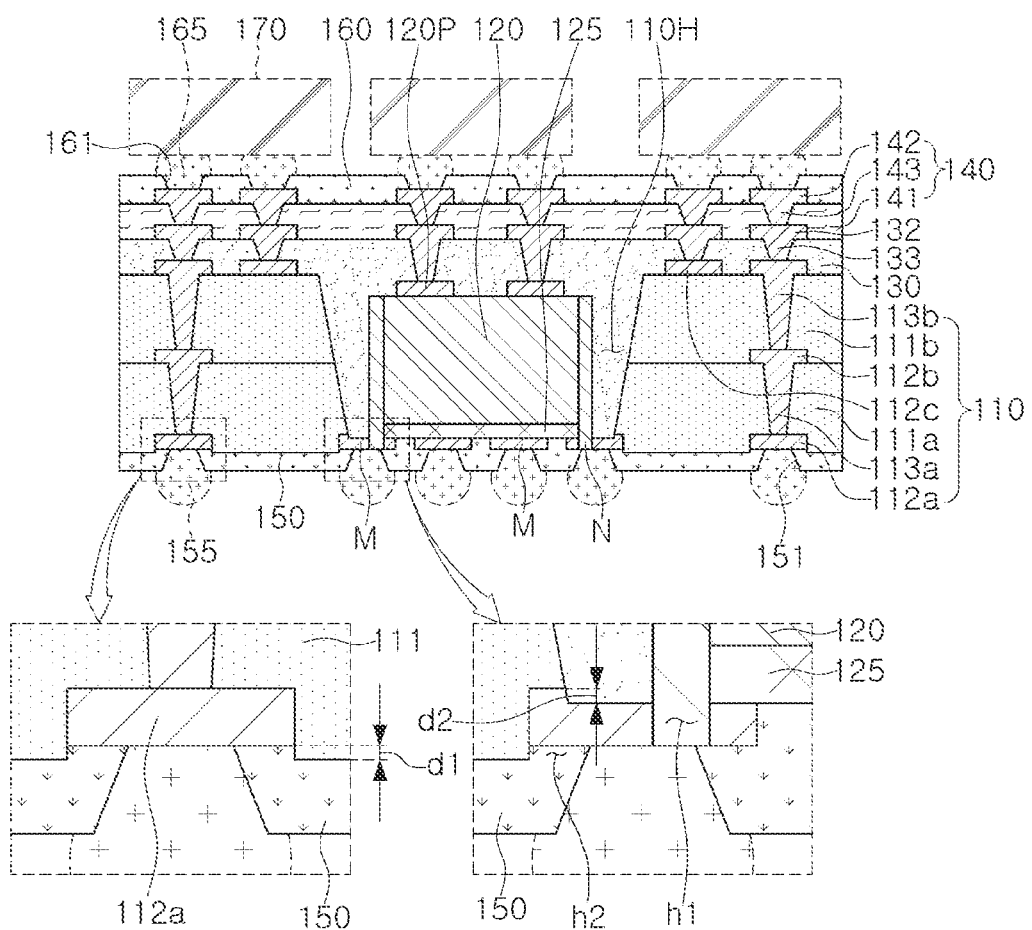
FIG. 20 is a cross-sectional diagram schematically illustrating another example of the substrate with the electronic component embedded therein.

FIG. 20 is a schematic cross-sectional view showing another example of a substrate having an electronic component embedded therein.

Referring to the drawings, in a substrate with an electronic component embedded therein 100D according to another example, a core structure 110 is formed in more multiple layers than in the substrate with the electronic component embedded therein 100A according to the above-described example. For example, the core structure 110 may include a 1-1 insulating layer 111a, a 1-1 wiring layer 112a embedded in a lower portion of the 1-1 insulating layer 111a, a 1-2 wiring layer 112b disposed on an upper surface of the 1-1 insulating layer 111a, a 1-1 via layer 113a penetrating through the 1-1 insulating layer 111a and electrically connecting the 1-1 wiring layer 112a and the 1-2 wiring layer 112b, a 1-2 insulating layer 111b disposed on the upper surface of the 1-1 insulating layer 111a and covering the 1-2 wiring layer 112b, a 1-3 wiring layer 112c disposed on an upper surface of the 1-2 insulating layer 111b, and a 1-2 via layer 113b penetrating through the 1-2 insulating layer 111b and electrically connecting the 1-2 wiring layer 112b and the 1-3 wiring layer 112c, and the cavity 110H may penetrate through the 1-1 insulating layer 111a and the 1-2 insulating layer 111b.

In addition, in the substrate with the electronic component embedded therein 100D according to another example, a build-up structure 140 is further disposed on the encapsulant 130, than in the substrate with the electronic component embedded therein 100A according to the above-described example. The build-up structure 140 includes a second insulating body including a second insulating layer 141, one or more third wiring layers 142 disposed on or in the second insulating body, and one or more third via layers 143 disposed in the second insulating body. A second passivation layer 160 may be disposed on the build-up structure 140. The second passivation layer 160 may have a plurality of second openings 161 respectively exposing at least a portion of the third wiring layers 142.

In addition, in the substrate with the electronic component embedded therein 100D according to another example, a build-up structure 140 is further disposed on the encapsulant 130, than in the substrate with an electronic component embedded therein 100A according to the above-described example. The build-up structure 140 includes a second insulating body including a second insulating layer 141, one or more third wiring layers 142 disposed on or in the second insulating body, and one or more third via layers 143 disposed in the second insulating body. A second passivation layer 160 may be disposed on the build-up structure 140. The second passivation layer 160 may have a plurality of second openings 161 respectively exposing at least a portion of the third wiring layers 142.

As set forth above, as one of various effects of the present disclosure, an electronic component embedded substrate having excellent heat dissipation effect can be provided.

As another of the various effects of the present disclosure, a substrate with an electronic component embedded therein having excellent wiring design efficiency may be provided.

In the example embodiments, the terms "side region," "side surface," and the like, may be used to refer to a surface formed taken in right/left directions, the terms "lower side," "lower portion," "lower surface," and the like, may be used to refer to directions facing downwardly with reference to a cross-section in the diagrams for ease of description, and the terms "upper side," "upper portion," "upper surfaces," and the like, may be used to refer to directions opposing the above directions. The notion that an element is disposed on a side region, an upper side, an upper region, or a lower resin may include the configuration in which the element is directly in contact with an element configured as a reference in respective directions, and the configuration in which the element is not directly in contact with the reference element. The terms may be defined as above for ease of description, and the scope of right of the example embodiments is not particularly limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

The terms used in the example embodiments are used to simply describe an example embodiment, and are not intended to limit the present disclosure. A singular term includes a plural form unless otherwise indicated.

While the example embodiments have been shown and described above, it will be apparent to those skilled in the art that modifications and variations could be made without departing from the scope of the present invention as defined by the appended claims.

What is claimed is:

1. A substrate with an electronic component embedded therein, comprising:
   a core structure including a first insulating body, a plurality of first wiring layers respectively disposed on or in the first insulating body, and one or more first via layers disposed in the first insulating body, the core structure having a cavity penetrating through at least a portion of the first insulating body;
   a first metal layer disposed on a bottom surface of the cavity;
   an electronic component disposed on the first metal layer in the cavity;
   a second metal layer spaced apart from an inner wall of the cavity and being in physical contact with a side surface of the electronic component; and
   an insulating material disposed between the inner wall of the cavity and the second metal layer.

2. The substrate with the electronic component embedded therein of claim 1, wherein the second metal layer surrounds four side surfaces of the electronic component.

3. The substrate with the electronic component embedded therein of claim 1, wherein the second metal layer is physical contact with the first metal layer.

4. The substrate with the electronic component embedded therein of claim 3, wherein the first metal layer has a groove portion, and
   a portion of the second metal layer is disposed in the groove portion.

5. The substrate with the electronic component embedded therein of claim 4, wherein the groove portion extends along four side surfaces of the electronic component.

6. The substrate with the electronic component embedded therein of claim 1, further comprising a first passivation layer disposed below the core structure, having a plurality of first openings respectively exposing at least a portion of a first wiring layer disposed on a lowermost side of the plurality of first wiring layers and at least a portion of the first metal layer.

7. The substrate with the electronic component embedded therein of claim 1, further comprising:
   an encapsulant disposed on the core structure, and being as the insulating material disposed in at least a portion of the cavity and embedding at least a portion of the electronic component;
   a second wiring layer disposed on the encapsulant; and
   a second via layer penetrating through the encapsulant, and connecting the second wiring layer to each of the first wiring layer and the electronic component.

8. The substrate with the electronic component embedded therein of claim 7, further comprising a second passivation layer disposed on the encapsulant, and having a plurality of second openings respectively exposing at least a portion of the second wiring layer.

9. The substrate with the electronic component embedded therein of claim 7, further comprising:
   a build-up structure including a second insulating body disposed on the encapsulant, one or more third wiring layers disposed on or in the second insulating body, and one or more third via layers disposed in the second insulating body; and
   a second passivation layer disposed on the build-up structure, and having a plurality of second openings respectively exposing at least a portion of a third wiring layer disposed on an uppermost side of the one or more third wiring layers.

10. The substrate with the electronic component embedded therein of claim 1, wherein the electronic component has a first surface on which a connection pad is disposed and a second surface opposite to the first surface, and the second surface is attached to the first metal layer through an adhesive film.

11. The substrate with the electronic component embedded therein of claim 1, wherein the core structure comprises a first core insulating layer, a first core wiring layer embedded in a lower portion of the first core insulating layer, a second core wiring layer disposed on an upper surface of the first core insulating layer, and a first core via layer penetrating through the first core insulating layer, and connecting the first and second core wiring layers,
   the cavity penetrates through the first core insulating layer,
   the first insulating body comprises the first core insulating layer,
   the first wiring layer comprises the first and second core wiring layers,
   the first via layer comprises the first core via layer,
   the first metal layer is located at a same level as the first core wiring layer, and
   at least a portion of the first metal layer is embedded in the first core insulating layer.

12. The substrate with the electronic component embedded therein of claim 11, wherein the core structure further comprises a second core insulating layer disposed on an upper surface of the first core insulating layer to cover the second core wiring layer, a second core wiring layer disposed on an upper surface of the second core insulating layer, and a second core via layer penetrating through the second core insulating layer and connecting the second and third core wiring layers,
   the cavity further penetrates through the second core insulating layer,
   the first insulating body further comprises the second core insulating layer,
   the first wiring layer further comprises the third core wiring layer, and
   the first via layer further comprises the second core via layer.

13. The substrate with the electronic component embedded therein of claim 11, wherein lower surfaces of each of the first core insulating layer and the first core wiring layer have a first step, and
   an upper surface of the first metal layer in a region exposed by the cavity and an upper surface of the first metal layer in a region embedded in the first core insulating layer have a second step.

14. A substrate with an electronic component embedded therein, comprising:
   a core structure including a core insulating layer, a first core wiring layer embedded in a lower portion of the core insulating layer, a second core wiring layer disposed on an upper surface of the core insulating layer, and a core via layer penetrating through the core insulating layer and connecting the first and second core wiring layer, the core structure having a cavity penetrating through the core insulating layer;
   a metal layer disposed on a bottom surface of the cavity, and having a pattern hole; and
   an electronic component disposed on the metal layer in the cavity,
   wherein the metal layer is located at a same level as the first core wiring layer, and
   at least a portion of the metal layer is embedded in the core insulating layer.

15. The substrate with the electronic component embedded therein of claim 14, wherein the metal layer comprises a plurality of metal patterns spaced apart from each other by the pattern hole,
   at least a portion of the plurality of metal patterns is connected to at least one ground pattern among the first core wiring layer and the second core wiring layer, and
   at least one of the remainder of the plurality of metal patterns is connected to at least one signal pattern among the first core wiring layer and the second core wiring layer.

16. A substrate, comprising:
   a core structure having a cavity and including an insulating body, one or more first wiring layers disposed on or in the insulating body, and one or more via layers disposed in the insulating body and connected to the one or more first wiring layers;
   a first metal layer disposed on or in the insulating layer;
   an electronic component disposed on the first metal layer in the cavity; and
   a second metal layer extending from the first metal layer to be in contact with a side surface of the electronic component;
   wherein the first metal layer has a groove portion, and
   a portion of the second metal layer is disposed in the groove portion.

17. The substrate of claim 16, wherein the second metal layer covers four side surfaces of the electronic component.

18. The substrate of claim 16, further comprising an encapsulant including an insulating material, disposed on the core structure, and having a portion disposed in the cavity to embed at least a portion of the electronic component,
   wherein the portion of the encapsulant disposed in the cavity is disposed between the second metal layer and the core structure.

19. The substrate of claim 16, wherein the first metal layer comprises a plurality of metal patterns spaced apart from each other.

20. The substrate of claim 16, wherein the electronic component has a first surface on which a connection pad is disposed and a second surface opposite to the first surface,
   the second surface faces the first metal layer, and
   the electronic component further comprises:
      an encapsulant disposed on the core structure;
      a second wiring layer disposed on the encapsulant; and
      a second via layer disposed in the encapsulant, and connecting the second wiring layer to the connection pad and one among the one or more first wiring layers.

* * * * *